United States Patent
Horng

(10) Patent No.: US 7,963,317 B2
(45) Date of Patent: *Jun. 21, 2011

(54) MINI-SIZED HEAT-DISSIPATING MODULE HAVING AN EXTRA STRENGTH OF ASSEMBLED RELATIONSHIP

(75) Inventor: Alex Horng, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 1124 days.

This patent is subject to a terminal disclaimer.

(21) Appl. No.: 11/727,114

(22) Filed: Mar. 23, 2007

(65) Prior Publication Data

US 2008/0174956 A1    Jul. 24, 2008

(30) Foreign Application Priority Data

Jan. 23, 2007   (TW) .............................. 96102483 A

(51) Int. Cl.
    *H05K 7/20* (2006.01)
(52) U.S. Cl. ........................ 165/80.3; 165/121; 361/697
(58) Field of Classification Search ................. 165/80.3, 165/185; 361/704, 710
See application file for complete search history.

(56) References Cited

U.S. PATENT DOCUMENTS

| | | | |
|---|---|---|---|
| 5,526,875 A * | 6/1996 | Lin | 165/80.3 |
| 6,141,214 A * | 10/2000 | Ahn | 361/679.48 |
| 6,145,586 A | 11/2000 | Lo et al. | |
| 6,172,416 B1 * | 1/2001 | Miyahara et al. | 257/712 |
| 6,181,556 B1 * | 1/2001 | Allman | 361/690 |
| 6,348,748 B1 * | 2/2002 | Yamamoto | 310/62 |
| 6,496,368 B2 | 12/2002 | Jui-Yuan | |
| 6,681,845 B1 * | 1/2004 | Yeh et al. | 165/122 |
| 6,765,794 B1 * | 7/2004 | Inoue | 361/695 |
| 7,117,928 B2 * | 10/2006 | Chen | 165/80.3 |
| 7,174,952 B1 * | 2/2007 | Hong et al. | 165/122 |
| 7,414,842 B2 * | 8/2008 | Hao et al. | 361/697 |
| 7,515,414 B2 * | 4/2009 | Horng | 361/697 |
| 7,684,190 B2 * | 3/2010 | Aoki et al. | 361/695 |
| 2004/0169771 A1 * | 9/2004 | Washington et al. | 348/374 |

* cited by examiner

*Primary Examiner* — Allen J Flanigan
(74) *Attorney, Agent, or Firm* — Muncy, Geissler, Olds & Lowe, PLLC

(57) ABSTRACT

A mini-sized heat-dissipating module includes a miniature heat-dissipating plate and a miniature fan unit. The miniature heat-dissipating plate has an assembling area, at least one airflow channel and at least one engaging portion. The assembling area and the airflow channel are provided on a top surface of the miniature heat-dissipating plate, wherein the assembling area is arranged at an end of the airflow channel. The miniature fan unit has an air inlet, an air outlet, a fan wheel and at least one engaging portion. The engaging portion of the miniature fan unit is engaged with that of the miniature heat-dissipating plate when assembled. An adhesive layer is further provided to combine the miniature fan unit with the miniature heat-dissipating plate.

5 Claims, 5 Drawing Sheets

MINI-SIZED HEAT-DISSIPATING MODULE HAVING AN EXTRA STRENGTH OF ASSEMBLED RELATIONSHIP

BACKGROUND OF THE INVENTION

1. Field of the Invention

The present invention relates to a mini-sized heat-dissipating module having an extra strength of assembled relationship. Particularly, the present invention relates to the mini-sized heat-dissipating module, including a miniature heat-dissipating plate and a miniature fan unit. More particularly, the present invention relates to the miniature heat-dissipating plate of the mini-sized heat-dissipating module having an adhesive layer to combine the miniature fan unit.

2. Description of the Related Art

Referring initially to FIG. 1, a conventional small-sized heat-dissipating module generally includes a heat sink member 7, a plurality of fixing elements 8 and a fan unit 9. The heat sink member 7 has a top surface on which to provide a plurality of fins 71 and a plurality of airflow channels 72. Each of the airflow channels 72 is formed between any two of the adjacent fins 71. Several assembling holes 73 are provided on a bottom plate of the heat sink member 7 to extend through the fixing elements 8 for assembling the small-sized heat-dissipating module. The fixing element 8 includes a resilient fastening member 81, an engaging shoulder 82 and an elastic member (i.e. spring member) 83. The resilient fastening member 81 is constructed on a first end of the fixing element 8, and is configured as a barb-like structure. A slit (unlabeled) is formed at the resilient fastening member 81 to provide a compressible space such that the structure of the resilient fastening member 81 is compressible in assembling operation. In addition, the engaging shoulder 82 correspondingly constructed on a second end of the fixing element 8.

In assembling operation of the small-sized heat-dissipating module, the rod body of the fixing element 8 can pass through the elastic member 83 such that the entire section of the elastic member 83 is confined between the resilient fastening member 81 and the engaging shoulder 82 for avoiding unwanted or unexpected release. Each corner portion of the fan unit 9 includes a through hole 91 to extend through the fixing element 8 and to be aligned with the associated assembling hole 73 of the heat sink member 7 if they are stacked each other.

In initially assembling operation of the small-sized heat-dissipating module, the through hole 91 of the fan unit 9 and the assembling hole 73 of the heat sink member 7 are aligned with each other. Each resilient fastening member 81 of the fixing elements 8 is successively extended through the through hole 91 of the fan unit 9 and the assembling hole 73 of the heat sink member 7. In this circumstance, each resilient fastening member 81 of the fixing element 8 may be compressed to pass through the through hole 91 of the fan unit 9 and the assembling hole 73 of the heat sink member 7. Once passed, the resilient fastening member 81 of the fixing element 8 can automatically expand its original diameter of the barb-like structure such that the resilient fastening member 81 of the fixing element 8 engages with a peripheral edge of the assembling hole 73 of the heat sink member 7.

To maintain contact within the stacked component configuration (fan unit 9 and heat sink member 7, or heat sink member 7 and fixing element 8), a stress force of the elastic member 83 with an appropriate spring rate is exerted between the fixing element 8 and the fan unit 9. In heat-dissipating operation, the fan unit 9 serves to generate a cooling airflow through the airflow channels 72 of the heat sink member 7 which is mounted to a heat source (not shown, e.g. IC component).

Currently, an electronic component (not shown, e.g. computer chip or microprocessor) is widely equipped with the heat-dissipating module for removing heats surrounding it. As the size of the electronic component has become increasingly reduced, there has been an increased need for reducing the size of the small-sized heat-dissipating module. A number of design limitations and drawbacks exist for the above-mentioned heat-dissipating module. In other words, the small-sized heat-dissipating module is unsuitable for applying to a miniature electronic component without any modification. However, the functional disadvantages of the small-sized heat-dissipating module in applying to the miniature electronic component are as follows: by way of example, there is a need for providing the fixing element 8 in assembling the stacked configuration of the heat-dissipating module. In addition to this, there are additional spaces for providing the assembling holes 73 of the heat sink member 7 and the through holes 91 of the fan unit 9 to receive the fixing elements 8. This results in a hard degree of reducing the size of the small-sized heat-dissipating module which is unsuitable for applying to the miniature electronic component. Accordingly, there is a need for redesigning the heat-dissipating module in applying to the miniature electronic component.

As is described in greater detail below, the present invention intends to provide a mini-sized heat-dissipating module, including a miniature heat-dissipating plate and a miniature fan unit. Each of the miniature heat-dissipating plate and the miniature fan unit provides an engaging portion while an adhesive layer is used to combine the miniature fan unit with the miniature heat-dissipating plate in such a way as to mitigate and overcome the above problem. A fan wheel of the miniature fan unit takes up a maximum area less than 1.6 cm$^2$ for rotation such that the heat-dissipating module is minimized for a miniature electronic component.

SUMMARY OF THE INVENTION

The primary objective of this invention is to provide a mini-sized heat-dissipating module, including a miniature heat-dissipating plate and a miniature fan unit. Each of the miniature heat-dissipating plate and the miniature fan unit provides an assembling portion while an adhesive layer is used to combine the miniature fan unit with the miniature heat-dissipating plate. Accordingly, the assembled relationship between the miniature heat-dissipating plate and the miniature fan unit is enhanced.

The secondary objective of this invention is to provide the mini-sized heat-dissipating module, wherein a fan wheel of the miniature fan unit takes up a maximum area less than 1.6 cm$^2$ for rotation. Accordingly, the size of the heat-dissipating module is minimized for a miniature electronic component.

The mini-sized heat-dissipating module in accordance with an aspect of the present invention includes a miniature heat-dissipating plate and a miniature fan unit. The miniature heat-dissipating plate has an assembling area, at least one airflow channel and at least one engaging portion. The assembling area and the airflow channel are provided on a top surface of the miniature heat-dissipating plate, wherein the assembling area is arranged at an end of the airflow channel. The miniature fan unit has an air inlet, an air outlet, a fan wheel and at least one engaging portion. The engaging portion of the miniature fan unit is engaged with that of the miniature heat-dissipating plate when assembled. An adhesive layer is further provided to combine the miniature fan unit with the miniature heat-dissipating plate.

In a separate aspect of the present invention, the fan wheel of the miniature fan unit takes up a maximum area less than 1.6 cm$^2$ for rotation.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2:
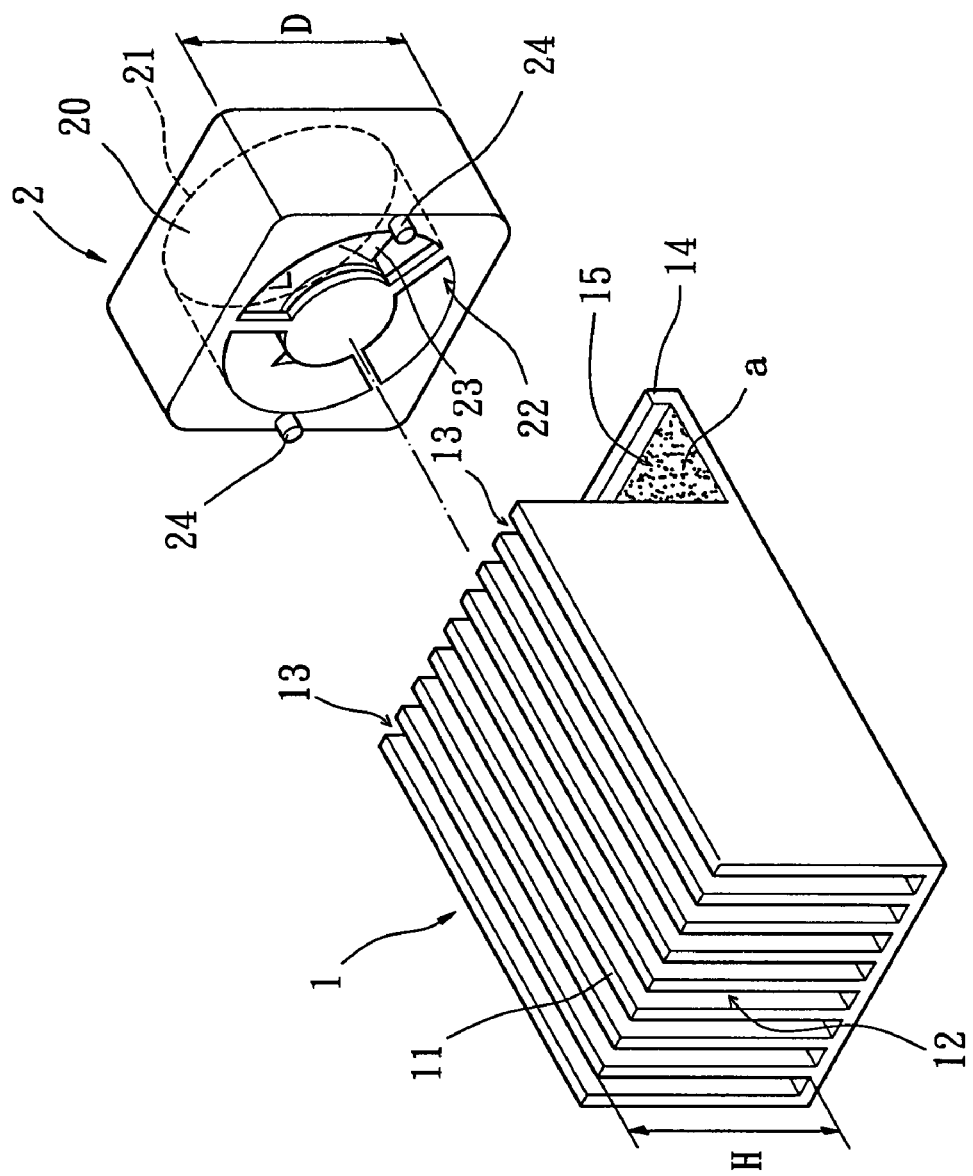
FIG. 2 is an exploded perspective view illustrating a mini-sized heat-dissipating module in accordance with a first embodiment of the present invention.

Referring now to FIG. 2, an exploded perspective view of a mini-sized heat-dissipating module in accordance with the first embodiment of the present invention is illustrated. In this preferred embodiment, the mini-sized heat-dissipating module includes a miniature heat-dissipating plate designated numeral 1 and a miniature fan unit designated numeral 2. The miniature fan unit 2 is supported on the miniature heat-dissipating plate designated numeral 1 mounted to a heat source (not shown). In the present invention, the term "miniature heat-dissipating plate or miniature fan unit" used herein means a component of the heat-dissipating module limited to apply to a miniature size of an electronic component. When used herein in connection with the miniature electronic component, the term "miniature" refers to the size of the electronic component, regardless of its function or performance.

Constructions of the miniature heat-dissipating plate 1 shall be described in detail, with reference to FIG. 2. The miniature heat-dissipating plate 1 is preferably made from metal, such as aluminum, copper, gold, silver or alloy thereof, having good thermal conductivity. In this preferred embodiment, the miniature heat-dissipating plate 1 is provided with a plurality of fins 11, at least one airflow channel 12, at least one engaging portion 13 or 14 and an assembling area 15. The fins 11, the airflow channel 12 and the assembling area 15 are arranged on an upper surface of the miniature heat-dissipating plate 1. Two sidewalls define the airflow channel 12. Any two adjacent fins 11 disposed in the airflow channel 12 define a longitudinal groove so as to increase the total thermal-exchanging area of the miniature heat-dissipating plate 1. Consequently, the miniature heat-dissipating plate 1 is so configured to have a higher heat-dissipating efficiency. Preferably, the miniature heat-dissipating plate 1 further includes a first engaging portion 13 and a second engaging portion 14 between which the assembling area 15 is arranged. In a preferred embodiment, the first engaging portion 13 is provided at one distal end of the airflow channel 12, and is selected from one of the longitudinal groove defined by the fins 11. The second engaging portion 14 is constructed from an upright bent wall of the miniature heat-dissipating plate 1. The first engaging portion 13 and the second engaging portion 14 are provided for easy guidance of the miniature fan unit 2 in the longitudinal and lateral directions, even when the miniature heat-dissipating plate 1 and the miniature fan unit 2 are not in perfect alignment with each other.

Constructions of the miniature fan unit 2 shall be described in detail, with reference to FIG. 2. The miniature fan unit 2 may be selected from an axial flow type or a blower type. In this preferred embodiment, the fan unit 2 is in the form of an axial flow type having an axial air inlet and an axial air outlet. The miniature fan unit 2 includes a housing body 20, an air inlet 21, an air outlet 22, a fan wheel 23 and a pair of engaging portions 24. The housing body 20 has an interior (unlabeled) to receive the fan wheel 23. The air inlet 21 is provided on a first side of the housing body 20 while the air outlet 22 is provided on a second side opposite to the first side. The air inlet 21 and the air outlet 22 are axially aligned with each other. In assembling operation, one of the air inlet 21 and the air outlet 22 may be aligned and connected with the distal end of the airflow channel 12 of the miniature heat-dissipating plate 1. In this preferred embodiment, the air outlet 22 is connected with the distal end of the airflow channel 12 of the miniature heat-dissipating plate 1. Preferably, the engaging portion 24 of the miniature fan unit 2 is in the form of pin or lug, and is arranged on the side of the housing body 20 adjacent to the air outlet 22.

The term "miniature fan unit" used herein defines the fan unit having a reduced size of the fan wheel taken up a maximum area less than 1.6 cm$^2$ for rotation so that the size of the heat-dissipating module can be further reduced. Accordingly, the mini-sized heat-dissipating module can be equipped in a miniature electronic device (e.g. minicomputer, PDA (personal digital assistance) and cellular phone).

In assembling operation, the engaging portions 24 of the miniature fan unit 2 are correspondingly aligned and engaged with the first engaging portions 13 of the miniature heat-dissipating plate 1 when the miniature fan unit 2 is inserted into the assembling area 15. The second engaging portion 14 of the miniature heat-dissipating plate 1 further engages with a bottom edge of the housing body 20 of the miniature fan unit 2. To accomplish a greater assembled relationship, there provides an adhesive layer (identified as "a") between a bottom surface of the assembling area 15 and a connecting surface of the housing body 20. In addition to the arrangement of the adhesive layer "a", the assembling area 15 of the miniature heat-dissipating plate 1 has a width slightly greater than a thickness of the miniature fan unit 2 so that the housing body 20 is securely engaged between the fins 11 and the second engaging portion 14 for completing the assembly of the mini-sized heat-dissipating module. Consequently, any unwanted disengagement of the miniature fan unit 2 from the miniature heat-dissipating plate 1 can be avoided.

Still referring to FIG. 2, the miniature heat-dissipating plate 1 and the miniature fan unit 2 of the present invention are combined without the need of providing an additional fastening member (e.g. screw nut, clip or fastener) in implementing the preferred embodiment. Advantageously, the process of assembling the mini-sized heat-dissipating module and the entire structure thereof are simplified.

In heat-dissipating operation, the air outlet 22 of the miniature fan unit 2 is aligned with distal ends of the longitudinal grooves formed in the airflow channel 12. Ambient air is sucked into the air inlet 21 and airflows are exhausted from the air outlet 22 such that cooling air can pass through the longitudinal grooves of the airflow channel 12. Finally, heated air can be discharged from another distal ends of the longitudinal grooves located at an end of the airflow channel 12 of the miniature heat-dissipating plate 1.

Once assembled, the miniature fan unit 2 set upright on the miniature heat-dissipating plate 1 takes up a vertical height. In a preferred embodiment, each top of the fin 11 is designed to have a vertical height (identified as "H") not greater than that of a width (identified as "D") of the housing body 20 so as to reduce the total height of the mini-sized heat-dissipating module or so as not to increase dimensions of the mini-sized heat-dissipating module. Accordingly, the mini-sized heat-dissipating module is suitable for providing in an interior of the miniature electronic device where an installation space is limited.

Figure 3:
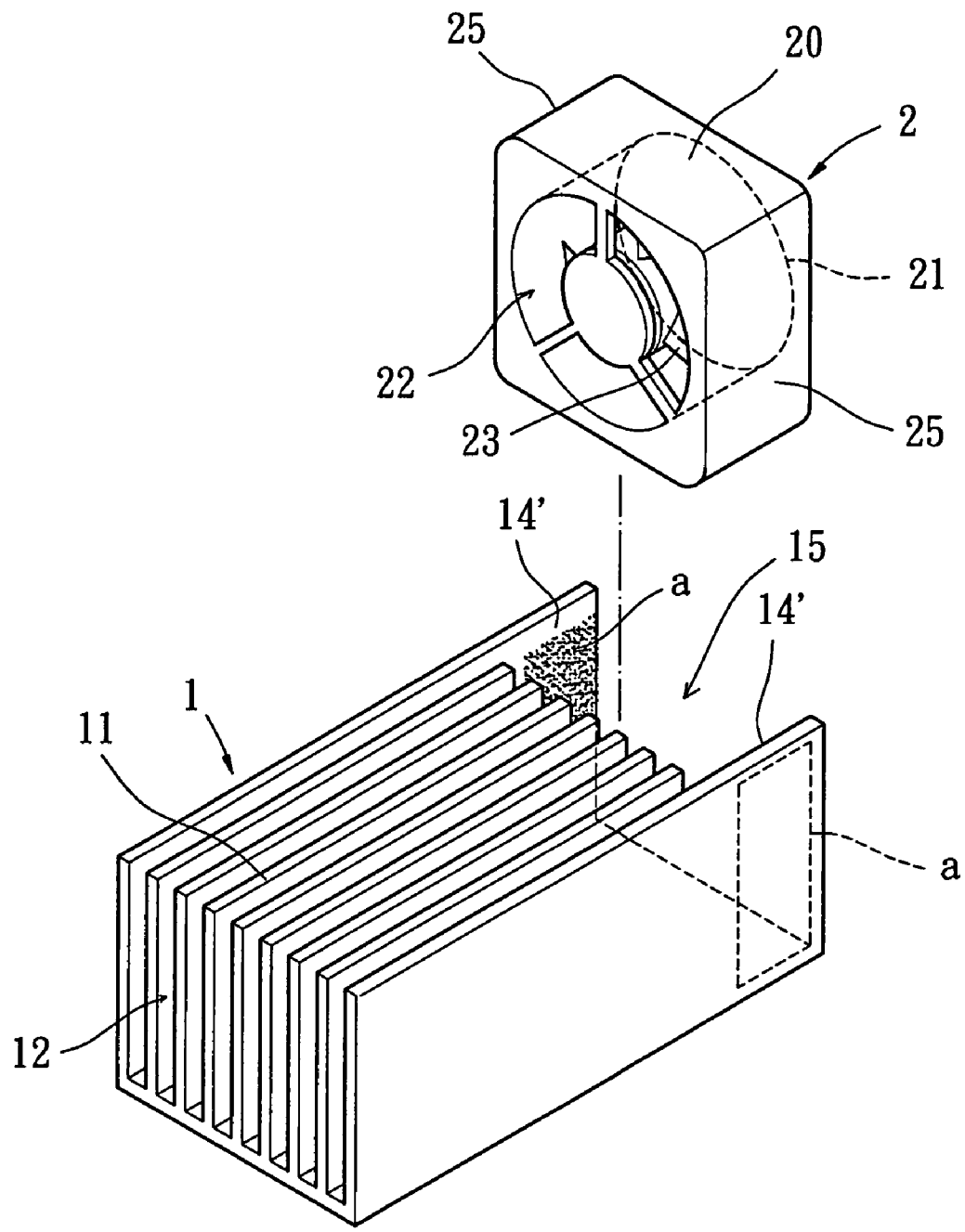
FIG. 3 is an exploded perspective view illustrating a mini-sized heat-dissipating module in accordance with a second embodiment of the present invention.

Turning now to FIG. 3, an exploded perspective view of a mini-sized heat-dissipating module in accordance with the second embodiment of the present invention is illustrated. In comparison with the first embodiment, each of the sidewalls of the miniature heat-dissipating plate 1 of the second embodiment extends to provide an extension wall to form the engaging portion 14'. In this preferred embodiment, the two extension walls of the engaging portions 14' located opposite ends of the assembling area 15 define a length slightly greater than a width of the miniature fan unit 2 so that the housing body 20 is securely engaged between the two engaging portions 14'. In this manner, two outer circumferential walls of the housing body 20 act as two engaging portions 25 of the miniature fan unit 2 to engage with the engaging portions 14' of the miniature heat-dissipating plate 1. In a preferred embodiment, the adhesive layer "a" is disposed between the engaging portion 14' of the miniature heat-dissipating plate 1 and the engaging portion 25 of the miniature fan unit 2 so as to enhance the assembled reliability of the mini-sized heat-dissipating module.

Figure 4:
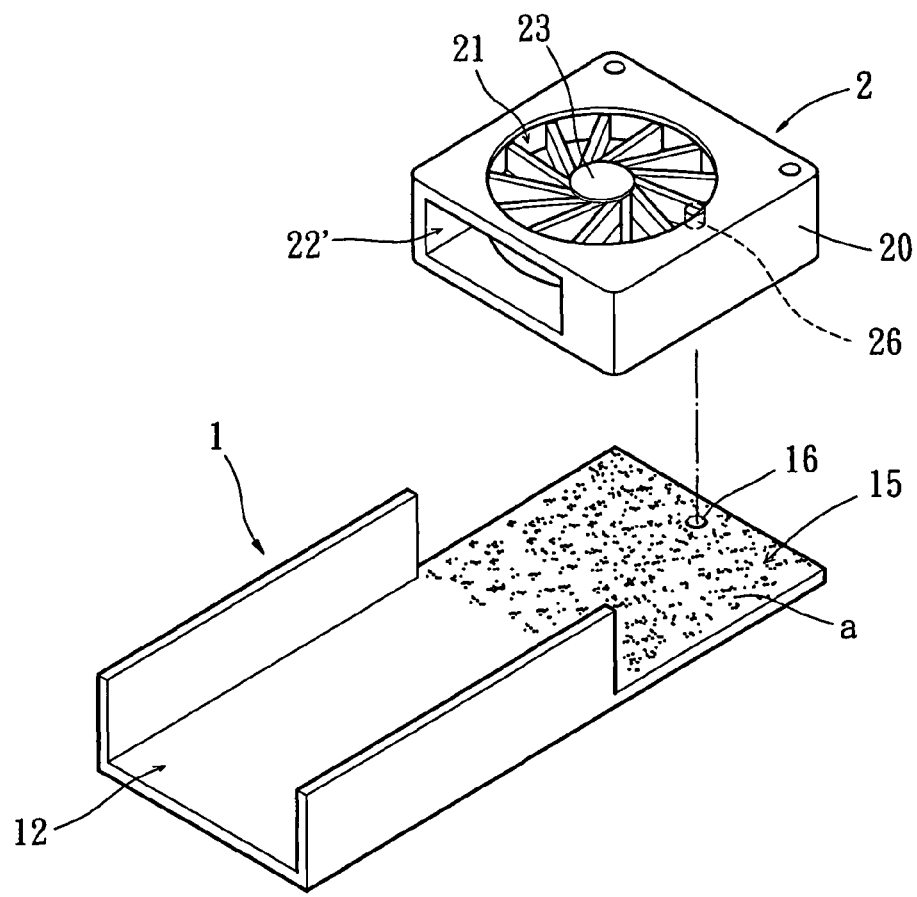
FIG. 4 is an exploded perspective view illustrating a mini-sized heat-dissipating module in accordance with a third embodiment of the present invention.

Turning now to FIG. 4, an exploded perspective view of a mini-sized heat-dissipating module in accordance with the third embodiment of the present invention is illustrated. In comparison with the first embodiment, the fan unit 2 of the third embodiment is in the form of a blower type having an axial air inlet 21 and a side air outlet 22'. In this preferred embodiment, the miniature heat-dissipating plate 1 only provides the assembling area 15 and two sidewalls between which to define the airflow channel 12. An aperture or recess is provided on the bottom surface of the assembling area 15 so as to form an engaging portion 16 of the miniature heat-dissipating plate 1. Correspondingly, the miniature fan unit 2 includes a positioning pin provided on an under surface of the housing body 20 to form an engaging portion 26 of the miniature fan unit 2 which is engaged with the engaging portion 16 of the miniature heat-dissipating plate 1 when assembled. In an alternative embodiment, the bottom surface of the assembling area 15 may be designed to provide a positioning pin while the under surface of the housing body 20 may be designed to provide an aperture or recess. In a preferred embodiment, a peripheral edge of the aperture or recess defines a predetermined shape and a predetermine size which are identical with that formed with an outer circumference of the positioning pin. In this preferred embodiment, the fins 11 of the miniature heat-dissipating plate 1 is omitted due to the fact that the width or size of the airflow channel 12 narrows or is too small.

Figure 5:
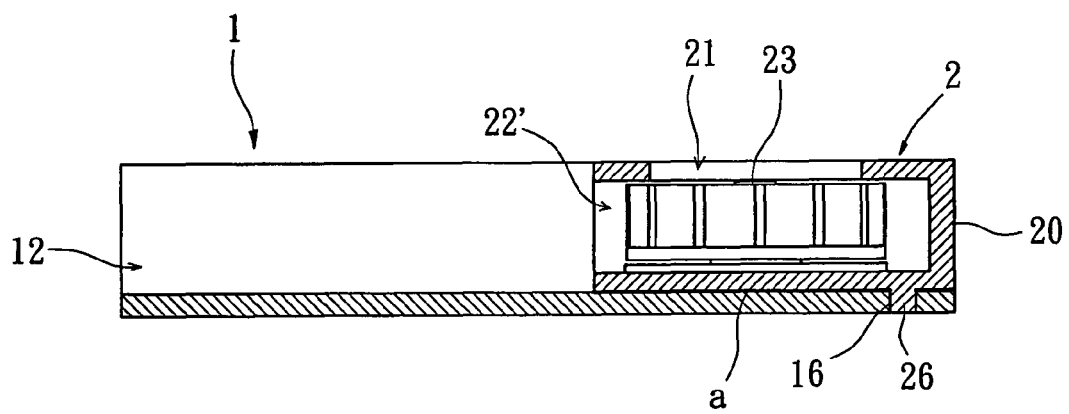
FIG. 5 is a cross-sectional view illustrating the mini-sized heat-dissipating module in accordance with the third embodiment of the present invention.

Turning now to FIG. 5, a cross-sectional view of the mini-sized heat-dissipating module in accordance with the third embodiment of the present invention is illustrated. The miniature fan unit 2 lies flat on the bottom surface of the miniature heat-dissipating plate 1. In assembling operation, the engagement of the positioning pin with the aperture can accomplish a perfect alignment of the side air outlet 22' of the miniature fan unit 2 with the airflow channel 12 of the miniature heat-dissipating plate 1. In a preferred embodiment, the adhesive layer "a" is disposed between the bottom surface of the assembling area 15 and the under surface of the housing body 20 so as to enhance the assembled reliability of the mini-sized heat-dissipating module.

Figure 6:
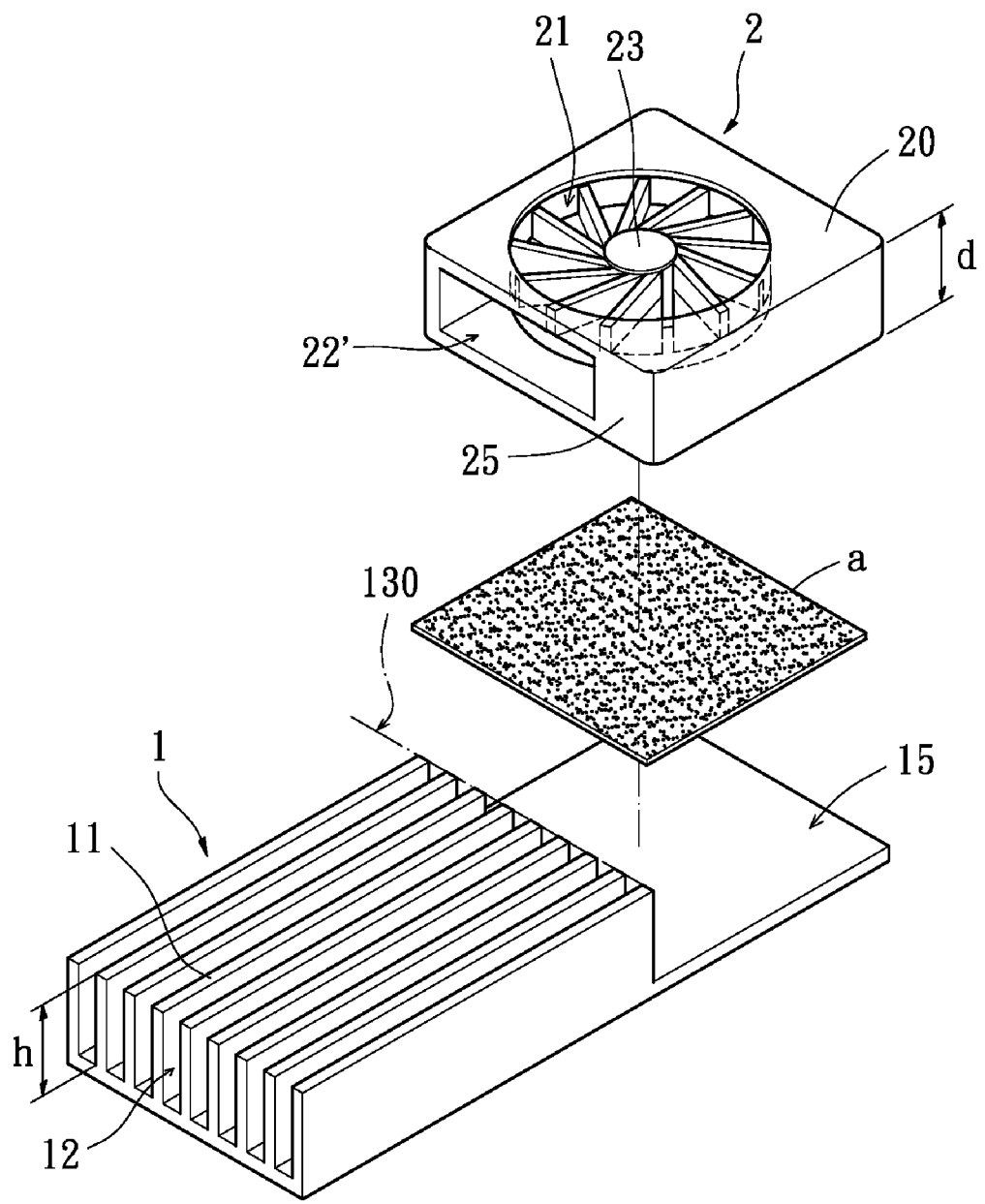
FIG. 6 is an exploded perspective view illustrating a mini-sized heat-dissipating module in accordance with a fourth embodiment of the present invention.

Turning now to FIG. 6, an exploded perspective view of a mini-sized heat-dissipating module in accordance with the fourth embodiment of the present invention is illustrated. In comparison with the third embodiment, the miniature heat-dissipating plate 1 and the miniature fan unit 2 of the fourth embodiment are designed to omit the structure of an aperture or recess and a positioning pin. Preferably, the adhesive layer "a" is only provided and is in the form of two-sided adhesive tape. In this preferred embodiment, arranged in the airflow channel 12 are the fins 11 whose distal ends define the engaging portion 130 to engage with the engaging portion 25 of the miniature fan unit 2 on which the side air outlet 22' is provided. In a preferred embodiment, each top of the fin 11 is designed to have a vertical height (identified as "h") not greater than that of a thickness of the housing body 20 so as not to increase dimensions of the mini-sized heat-dissipating module.

Figure 1:
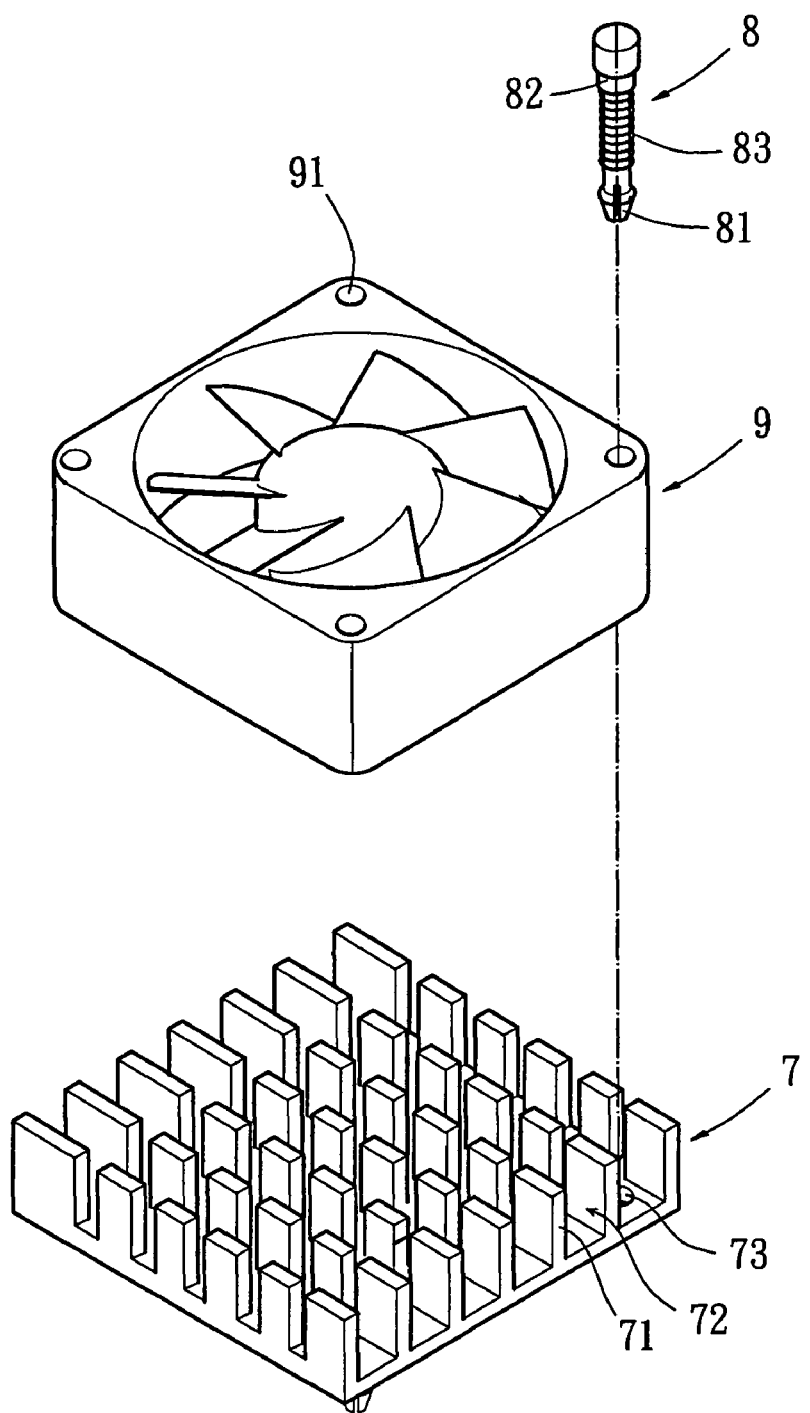
FIG. 1 is an exploded perspective view illustrating a conventional small-sized heat-dissipating module in accordance with the prior art.

As has been discussed above, the fan unit 9 is stacked and mounted on the heat sink member 7 by the fixing elements 8, as shown in FIG. 1. Disadvantageously, there provide a series of the assembling hole 73 of the heat sink member 7 and a series of the through holes 91 of the fan unit 9 in carrying out the stacked heat-dissipating module configuration. Conversely, the miniature heat-dissipating plate 1 of the present invention is designed to provide the adhesive layer "a" and the engaging portion to combine the miniature fan unit 2 which includes a fan wheel 23 taking up a maximum area less than 1.6 cm$^2$ for rotation.

Although the invention has been described in detail with reference to its presently preferred embodiment, it will be understood by one of ordinary skill in the art that various modifications can be made without departing from the spirit and the scope of the invention, as set forth in the appended claims.

What is claimed is:
1. A mini-sized heat-dissipating module, comprising:
  a miniature heat-dissipating plate having an assembling area, an airflow channel, a plurality of fins and an engaging portion, the assembling area and the airflow channel provided on a top surface of the miniature heat-dissipating plate, the assembling area being arranged at an end of the airflow channel, the fins being arranged in the airflow channel and having distal ends adjacent to the assembling area to define the engaging portion;
  a miniature fan unit having a housing body, an air inlet, an air outlet, a fan wheel and at least one engaging portion, said fan wheel taking up a maximum area of less than 1.6 cm$^2$ for rotation; and an adhesive layer disposed between a surface of the miniature fan unit and the assembling area of the miniature heat-dissipating plate;

wherein when assembled, the engaging portion of the miniature fan unit is engaged with the engaging portion of the miniature heat-dissipating plate such that one of the air inlet and the air outlet of the miniature fan unit is aligned with the airflow channel of the miniature heat-dissipating plate.

2. The mini-sized heat-dissipating module as defined in claim 1, wherein the engaging portion of the miniature fan unit provides a side air outlet.

3. The mini-sized heat-dissipating module as defined in claim 1, wherein the adhesive layer is in the form of two-sided adhesive tape.

4. The mini-sized heat-dissipating module as defined in claim 1, wherein each of the fins is designed to have a vertical height not greater than that of a thickness of the housing body.

5. The mini-sized heat-dissipating module as defined in claim 1, wherein the miniature fan unit is selected from an axial flow type or a blower type.

* * * * *